United States Patent
Ambatipudi et al.

(10) Patent No.: US 8,386,828 B1
(45) Date of Patent: Feb. 26, 2013

(54) CIRCUIT FOR ESTIMATING LATENCY THROUGH A FIFO BUFFER

(75) Inventors: Sai Lalith Chaitanya Ambatipudi, San Jose, CA (US); Seu Wah Low, San Jose, CA (US); Christopher J. Borrelli, Campbell, CA (US); Loren Jones, Aromas, CA (US)

(73) Assignee: Xilinx, Inc., San Jose, CA (US)

( * ) Notice: Subject to any disclaimer, the term of this patent is extended or adjusted under 35 U.S.C. 154(b) by 339 days.

(21) Appl. No.: 12/817,082

(22) Filed: Jun. 16, 2010

(51) Int. Cl.
- *G06F 1/00* (2006.01)
- *G06F 1/04* (2006.01)
- *H03K 19/096* (2006.01)
- *H03K 21/00* (2006.01)
- *H03L 7/00* (2006.01)
- *G01R 25/00* (2006.01)
- *G01D 18/00* (2006.01)

(52) U.S. Cl. .......... 713/500; 713/502; 326/96; 327/160; 377/27; 702/79; 702/89

(58) Field of Classification Search ................... 713/500, 713/502; 326/96; 327/160; 377/27; 702/79, 702/89
See application file for complete search history.

(56) References Cited

U.S. PATENT DOCUMENTS

| | | | |
|---|---|---|---|
| 5,532,944 A * | 7/1996 | Battista .............................. | 708/3 |
| 7,287,105 B1 * | 10/2007 | Owen et al. ..................... | 710/52 |
| 7,594,048 B1 | 9/2009 | Edwards et al. | |
| 7,924,054 B1 * | 4/2011 | Doubler et al. ................. | 326/41 |
| 2005/0286507 A1 * | 12/2005 | Österling et al. ............. | 370/363 |

* cited by examiner

*Primary Examiner* — Stefan Stoynov (74) *Attorney, Agent, or Firm* — LeRoy D. Maunu; Thomas George (57) ABSTRACT

Circuits and methods are provided for estimating a latency through a FIFO buffer. A first detector detects first instances of a pattern in first data values serially written to a write port of the FIFO buffer. A second detector detects second instances of the pattern in second data values serially read from a read port of the FIFO buffer. The second data values are the first data values delayed by the latency through the FIFO buffer. A counter counts a count of active transitions of a sample clock signal. The counter starts on each detected first instance and stops on each detected second instances. The count provides an estimate of the latency of the FIFO buffer.

18 Claims, 4 Drawing Sheets

*FIG. 5*

CIRCUIT FOR ESTIMATING LATENCY THROUGH A FIFO BUFFER

FIELD OF THE INVENTION

An embodiment of the present invention generally relates to first-in first-out (FIFO) data buffers, and more particularly to phase compensation buffers.

BACKGROUND

The performance of a communication link can be monitored by measuring the latencies of components of the communication link. In addition, measured latencies can be used to improve the performance of the communication link.

Phase compensation buffers contribute to the latency of a communications link. In one example, a receiver for a communication link has a phase compensation buffer that compensates for the unknown and potentially changing phase relationship between transmit and receive clocks for the communication link.

For a phase compensation buffer with write and read pointers, the latency of the phase compensation buffer can be determined from the write and read pointers. However, the latency cannot be determined to a fraction of a cycle of the transmit or receive clocks because the write and read pointers change too quickly.

The present invention may address one or more of the above issues.

SUMMARY

Various embodiments of the invention provide a circuit for estimating a latency through a FIFO buffer. A first detector detects first instances of a pattern in first data values serially written to a write port of the FIFO buffer. A second detector detects second instances of the pattern in second data values serially read from a read port of the FIFO buffer. The second data values are the first data values delayed by the latency through the FIFO buffer. A counter counts a count of active transitions of a sample clock signal. The counter starts on each detected first instance and stops on each detected second instances. The count provides an estimate of the latency of the FIFO buffer.

In another embodiment, a circuit arrangement includes a FIFO buffer, first and second detectors, and a counter. The FIFO buffer has a write port and a read port. The first detector is coupled to a write port of the FIFO buffer and is configured to detect a first plurality of instances of a pattern in first data values serially written to the write port. The second detector is coupled to a read port of the FIFO buffer and is configured to detect a second plurality of instances of the pattern in second data values serially read from the read port. The second data values are the first data values delayed by a latency through the FIFO buffer. The counter is coupled to outputs of the first and second detectors and is configured to count active transitions of a sample clock signal. The counter is started in response to each detected instance of the first plurality of instances and stopped in response to each detected instance of the second plurality of instances. The count provides an estimate of the latency of the FIFO buffer.

Various other embodiments of the invention provide a method for estimating a latency through a FIFO buffer. First instances of a pattern are detected in first data values serially written to a write port of the FIFO buffer. Second instances of the pattern are detected in second data values serially read from a read port of the FIFO buffer. The second data values are the first data values delayed by the latency through the FIFO buffer. A count of active transitions of a sample clock signal is counted. The counting starts on each detected first instance and stops on each detected second instance. The count provides an estimate of the latency of the FIFO buffer.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings in which.

DETAILED DESCRIPTION OF THE DRAWINGS

Figure 1:
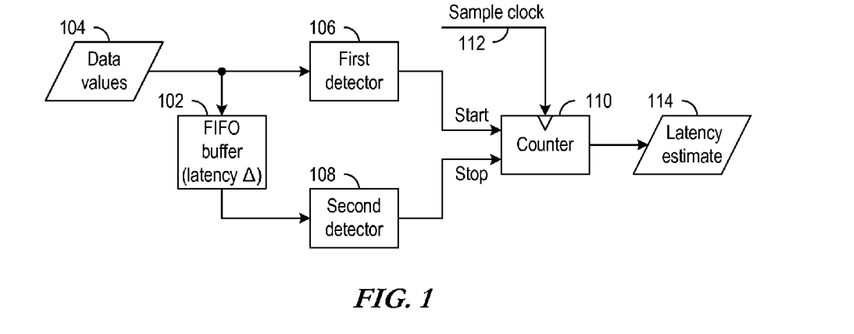
FIG. 1 is a dataflow diagram of a circuit for estimating latency through a FIFO buffer in accordance with various embodiments of the invention.

FIG. 1 is a dataflow diagram of a circuit for estimating latency through a FIFO buffer 102 in accordance with various embodiments of the invention. In certain embodiments of the invention, the FIFO buffer 102 is part of a receiver for a communication link and the FIFO buffer 102 compensates for a varying phase relationship between the local clock and the locally recovered remote transmit clock. In certain other embodiments of the invention, the FIFO buffer 102 is part of a transmitter for a communication link and the FIFO buffer 102 compensates for a varying phase relationship that changes in temperature and voltage produce in separate clock distribution trees for various versions of the transmit clock. As the phase varies between the transmit and receive clocks, the latency of the FIFO buffer 102 varies, and the circuit estimates this varying latency of the FIFO buffer 102. In one embodiment, the estimate of the varying latency of the FIFO buffer 102 helps link management protocols accurately schedule usage of a shared media for the communication link.

Data values 104 repeat instances of a pattern and the data values 104 are serially written to a write port of the FIFO buffer 102. In one embodiment, the pattern repeats a block of zero values followed by a block of one values and the blocks of zero and one values all have the same length for a 50% duty cycle.

The first detector 106 detects instances of the pattern in the data values 104. The second detector 108 similarly detects instances of the pattern in the data values read from a read port of the FIFO buffer 102. These data values read from the FIFO buffer 102 are the data values 104 delayed by the latency through the FIFO buffer 102. In one embodiment, detectors 106 and 108 detect each pattern by detecting the transition between the last zero value of the pattern's block of zero values and the first one value of the pattern's subsequent block of one values.

Counter 110 counts active transitions of the sample clock signal on line 112. The counter starts at an initial count each time the first detector 106 detects an instance of the repeating pattern in the data values 104, and stops each time the second detector 108 detects an instance of the repeating pattern in the delayed data values read from the FIFO buffer 102. Each terminal count of the stopped counter provides an estimate 114 of the latency of the FIFO buffer 102 measured in sampling periods between the active transitions of the sample clock signal on line 112. Certain other embodiments calculate a running average of the terminal counts to provide the estimate 114 of the latency of the FIFO buffer 102.

In another embodiment, the counter 110 need not actually be stopped when the second detector 108 detects the pattern. Stopping counter 110 includes capturing the current running count as a latency estimate 114 each time the second detector 108 detects the pattern.

Figure 2:
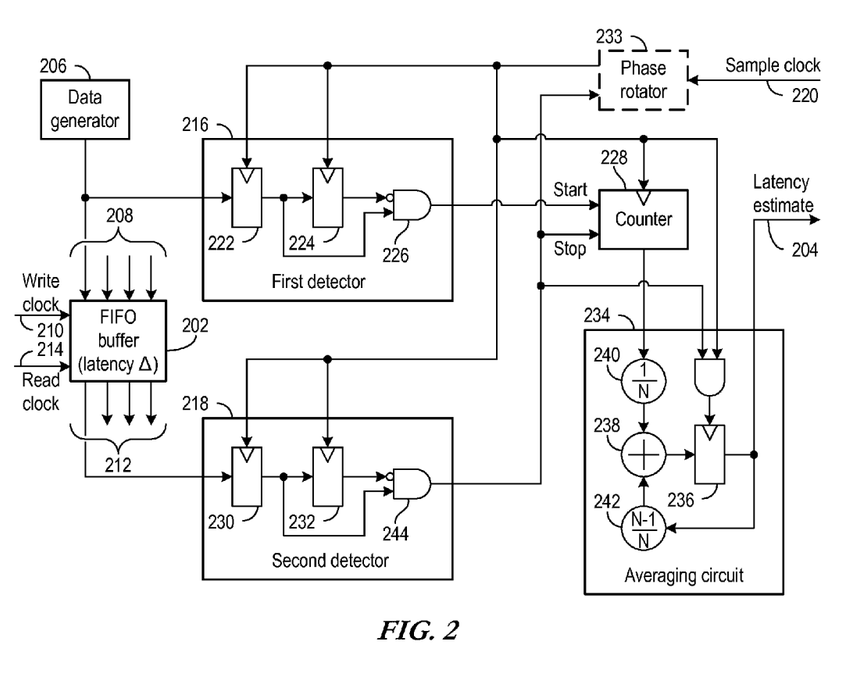
FIG. 2 is a block diagram of a circuit for estimating latency through a FIFO buffer in accordance with various embodiments of the invention.

FIG. 2 is a block diagram of a circuit for estimating latency through a FIFO buffer 202 in accordance with various embodiments of the invention. The circuit provides on line 204 a continuously updated estimate of the latency of the FIFO buffer 202. Some embodiments of the invention include optional phase rotator 233 for rotating the phase of the sample clock signal on line 220.

Data generator 206 generates and serially writes data values to the write port on lines 208 of the FIFO buffer 202. The write port on lines 208 has a number of bits for writing an input data word into the FIFO buffer 202 at each active transition of a write clock signal on line 210. The data values from data generator 206 are serially written to one of the bits of the input data word of the write port on lines 208 at the active transitions of the write clock signal on line 210. In one embodiment, the remaining bits of the write port on lines 208 carry data communicated over a communication link.

The read port on lines 212 has a corresponding number of bits for providing an output data word from the FIFO buffer 202 at each active transition of a read clock signal on line 214. At each active transition of the read clock signal on line 214, the FIFO buffer 202 updates the output data word provided at the read port on lines 212. After the latency of the FIFO buffer 202, the input data words written into the FIFO buffer 202 become available as output data words from the read port on lines 212. The delayed data values are serially read from a corresponding one of the bits of the read port on lines 212 at the active transitions of the read clock signal on line 214.

In one embodiment, the write clock signal on line 210 and the read clock signal on line 214 are plesiochronous. In this embodiment, the write and read clock signals on lines 210 and 214 have a nominally shared period and an indeterminately varying phase relationship that is a varying multiple of the nominally shared period plus a varying fraction of the nominally shared period. The latency of the FIFO buffer 202 is the varying multiple of the nominally shared period plus the varying fraction of the nominally shared period.

In another embodiment, the write clock signal on line 210 and the read clock signal on line 214 are synchronous with a nominally shared period and an indeterminately varying phase relationship that is a varying multiple of the nominally shared period plus a varying fraction of the nominally shared period. In this embodiment, the nominally shared period is the synchronously shared period. The latency of the FIFO buffer 202 is the varying multiple of the nominally shared period plus the varying fraction of the nominally shared period.

The number of data bits in the write port on lines 208 differs from the number of data bits in the read port on lines 212 in one embodiment. For example, the read port on lines 212 has twice the number of bits of the write port on lines 208, and the read clock signal on line 214 has nominally half the frequency of the write clock signal on line 210. In this example, the data values from data generator 206 are serially written to one bit of the write port on lines 208 and serially read from a pair of bits of the read port on lines 212. Embodiments of the invention generally write the data values serially to one bit of the write port on lines 208 and/or read the data values serially from one bit of the read port on lines 212.

The data generator 206 generates data values that repeat instances of a pattern that includes a block of zero values followed by a block of one values. Thus, each pattern includes a single zero-to-one transition between the last zero value of the pattern's block of zero values and the first one value of the pattern's subsequent block of one values.

Detector 216 detects this zero-to-one transition within each repeated pattern in the data values produced by data generator 206. At active transitions of the sample clock signal on line 220, register 222 samples the data values that data generator 206 writes into FIFO buffer 202. At each active transition of the sample clock signal on line 220, the data value currently in register 222 transfers to register 224 before register 222 samples the next data value from data generator 206. AND gate 226 has an inverting input driven by register 224 and a non-inverting input driven by register 222. Thus, AND gate 226 asserts its output whenever data generator 206 generates data values that transition from a zero value to a one value. Similarly, detector 218 detects corresponding transitions in the delayed data values read from FIFO buffer 202.

Counter 228 starts counting from an initial count each time detector 216 detects a zero-to-one transition in the data values from data generator 206, and counter 228 stops counting at a terminal count when detector 218 detects the corresponding zero-to-one transition in the delayed data values. Thus, counter 228 counts active transitions of the sample clock signal on line 220 occurring during the latency of the FIFO buffer 202.

To ensure that detector 218 stops counter 228 before detector 216 detects the zero-to-one transition for the next pattern, the pattern has a duration greater than an upper limit on the latency of the FIFO buffer 202. The duration of each pattern is the number of zero and one values in the pattern times the nominal period of the write and read clock signals on lines 210 and 214. In one embodiment with generous margin, the pattern has a duration of twice the maximum possible latency for the FIFO buffer 202, and has a 50% duty cycle because the number of zero values equals the number of one values in the pattern.

To ensure that detector 218 successfully stops the counter 228 for each transition detected by the other detector 216, registers 230 and 232 should detect the delayed zero-to-one transition regardless of the relative phases of the sample clock signal on line 220 and the read clock signal on line 214. To ensure that register 232 samples a zero value in the pattern's block before the transition and register 230 samples a one value in the pattern's block after the transition, the durations of these two blocks should each be greater than the sampling period between active transitions of the sample clock signal on line 220. A data pattern with a 50% duty cycle has a number of the zero values in the pattern equaling a number of the one values in the pattern. Because each zero and one value in the pattern has a duration equaling a nominal period shared by the read and write clock signals on lines 210 and 214, the number of zero values and the number of one values in the pattern each exceed a number of the nominally shared periods sufficient to exceed the sampling period of the sample clock signal on line 220.

Thus, the data generator 206 generates a repeating pattern that has a duration of greater than the upper limit on the latency of the FIFO buffer 202, and has durations of the block of zero values and the block of one values that are each greater than the sampling period between active transitions of the sample clock signal on line 220. However, the restriction that the block durations should be greater than the sampling period is satisfied by appropriately selecting the period of the sample clock signal on line 220 in one embodiment. In another embodiment, the requirement that detector 218 stops counter 228 before detector 216 detects the next pattern is eliminated by a counter 228 that counts an offset amount that is initialized to zero, and the offset amount is incremented for each pattern transition detected by detector 216 and decremented for each pattern transition detected by detector 218.

In various embodiments, the sample clock signal on line 220 is synchronous to the write clock signal on line 210 and/or the read clock signal on line 214. However, the optional phase rotator 233 rotates the phase of the sample clock signal on line 220 after each count for the detected instances of the pattern, such that the estimate on line 204 of the latency averages latency counts from samples across the full 360-degrees of the phase of the sample clock signal on line 220.

In various other embodiments, the sample clock signal on line 220 is asynchronous with both the write clock signal on line 210 and the read clock signal on line 214. The phase rotator 233 is omitted with the sample clock signal on line 220 directly drives the detectors 216 and 218, the counter 228, and the averaging circuit 234. The write and read clock signals on lines 210 and 214 are synchronous with a varying phase in one embodiment, and asynchronous and plesiochronous in another embodiment.

Data generator 206 generally outputs a data value for each active transition of the write clock signal on line 210. The output of register 222 of detector 216 is metastable when an asynchronous sample clock signal on line 220 causes sampling of the output of the data generator 206 during a transition. Register 222 resolves any such metastability to synchronize between the clock domains of the write clock signal on line 210 and the sample clock signal on line 220. However, before the metastability is resolved, AND gate 226 might receive a metastable input. In one embodiment, register 222 is two or more series connected registers to prevent propagation of metastability to logic gates, such as AND gate 226. Register 230 of detector 218 similarly synchronizes between the clock domains of the read clock signal on line 214 and the sample clock signal on line 220.

For a sample clock signal on line 220 that is asynchronous with both the write and read clock signals on lines 210 and 214, the count from counter 228 of active transitions of the sample clock signal on line 220 generally varies between detected patterns in the data values. Depending upon the asynchronous phase relationship between the sample clock signal on line 220 and the write and read clock signals on lines 210 and 214, the count from counter 228 is either rounded up or rounded down to an integer number of the sampling periods of the sample clock signal on line 220.

The averaging circuit 234 averages the counts from counter 228. Averaging circuit 234 includes a register 236 that continuously outputs a varying estimate on line 204 of the latency. This estimate includes integer and fractional values, and the estimate is the integer value times the sampling period between the active transitions of the sample clock signal on line 220 plus the factional value of the sampling period.

For each detected pattern, adder 238 adds a scaling 240 of the terminal value of the count for the detected pattern and a scaling 242 of the preceding estimate of the latency from register 236, and register 236 is updated with the result from adder 238. The sum of the scaling fractions from scaling 240 and the scaling 242 is generally unity. For a scaling fractions of 1/N for scaling 240 and (N−1)/N for scaling 242 with N equaling the power of two of $2^n$, the latency estimate on line 204 has n bits in the fractional value of the latency estimate.

For a sample clock signal on line 220 that is asynchronous with both the write and read clock signals on lines 210 and 214, the terminal counts from counter 228 effectively randomly sample the latency of the FIFO buffer 202, such that after averaging a sufficient number of these terminal counts, the average statistically has a resolution and accuracy that is a fraction of the period between the active transitions of the sample clock signal one line 220. In one embodiment, the estimate 204 of the latency of the FIFO buffer 202 is continuously updated with a resolution and accuracy that are less than one-tenth of the sampling period between the active transitions of the sample clock signal on line 220.

Figure 3A:
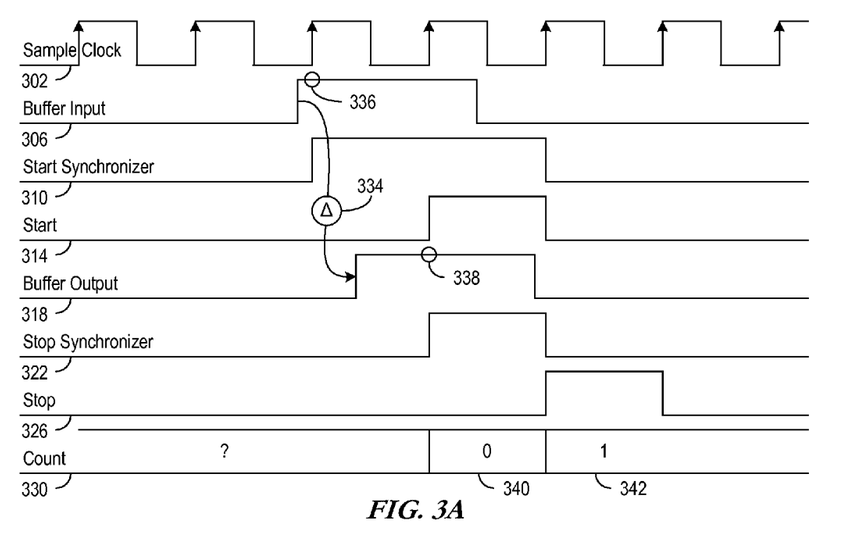
FIGS. 3A and 3B are timing diagrams of example operation of a circuit for estimating latency through a FIFO buffer in accordance with various embodiments of the invention.
Figure 3B:
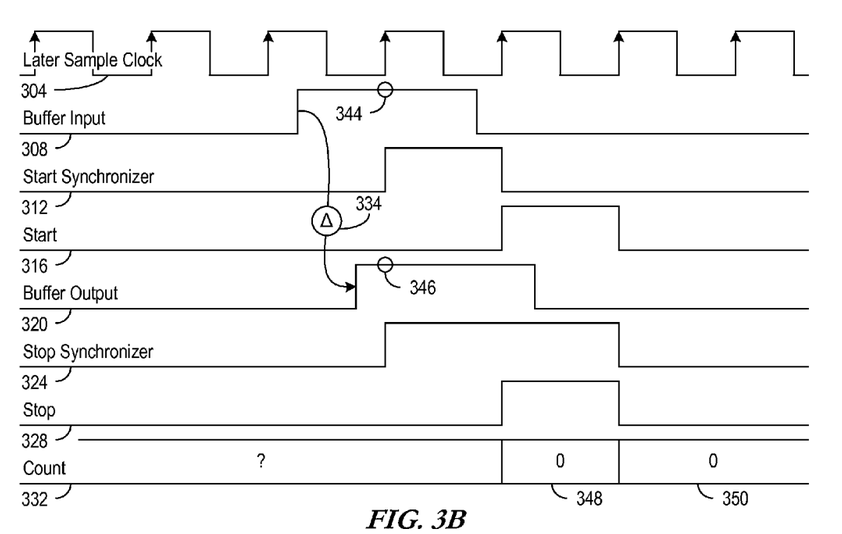

FIGS. 3A and 3B are timing diagrams of example operation of a circuit for estimating latency through a FIFO buffer in accordance with various embodiments of the invention. FIGS. 3A and 3B show two waveforms 302 and 304 of various phases of a sample clock signal.

In one embodiment, the sample clock waveforms 302 and 304 correspond to the sample clock signal on line 220 of FIG. 2, the buffer input waveforms 306 and 308 correspond to the data values produced by data generator 206 and written into FIFO buffer 202, the start synchronizer waveforms 310 and 312 correspond to the output of register 222, the start waveforms 314 and 316 correspond to the output of AND gate 226, the buffer output waveforms 318 and 320 correspond to the data values delayed by the latency of the FIFO buffer 202, the stop synchronizer waveforms 322 and 324 correspond to the output of register 230, the stop waveforms 326 and 328 correspond to the output of AND gate 244, and the count waveforms 330 and 332 correspond to the output of counter 228.

While embodiments of the invention generally have a repeating pattern for the data values, for clarity FIGS. 3A and 3B show buffer input and output waveforms 306, 308, 318, and 320 having a single pattern of a block of one values between two blocks of zero values.

The sample clock waveforms 302 and 304 sample the FIFO buffer input and output waveforms 306, 308, 318, and 320 for a FIFO buffer having a latency 334 that is currently fixed at half the sampling period between the active rising transitions (shown with arrows) of the sample clock waveforms 302 and 304. The latency 334 is also about 60% of the upper limit on the latency for the FIFO buffer, and the duration of the one values on the buffer input waveforms 306 and 308 (and the buffer output waveforms 318 and 320) is set at twice this upper limit on the latency as previously discussed for an embodiment with generous margin. The duration of the one values on the buffer input waveforms 306 and 308 are also greater than the sampling period to ensure a pulse on the stop waveforms 326 and 328 for every pulse on the start waveforms 314 and 316 as previously discussed.

In other embodiments, the active transitions are falling transitions of the sample clock signal or both rising and falling transitions of the sample clock signal.

In FIG. 3A, the sample clock waveform 302 has a phase that samples a sample 336 of the buffer input waveform 306 slightly after the pattern has its zero-to-one transition. The start synchronizer waveform 310 has a rising transition in response to this sample 336 and remains at a one value until a zero value is sampled in the buffer input waveform 306 at a subsequent rising transition of the sample clock waveform 302. The start waveform 314 has a pulse of a single cycle of the sample clock waveform 302 after this rising transition is observed on the start synchronizer waveform 310.

The sample 338 of the buffer output waveform 318 causes a rising transition in the stop synchronizer waveform 322, and the stop waveform 326 has a pulse of a single cycle of the sample clock waveform 302 after this rising transition is observed on the stop synchronizer waveform 322.

The pulse of the start waveform 314 causes the count waveform 330 to be asynchronously cleared at current count 340, and the count waveform counts rising transitions of the sample clock waveform 302 until the pulse on the stop waveform 326 stops the counting at terminal count 342.

In FIG. 3B, because samples 344 and 346 occur on the same rising transition of the sample clock waveform 304, the start and stop waveforms 316 and 328 have concurrent pulses. Thus, count is asynchronously cleared at current count 348, and the value of zero of current count 348 becomes the value of the terminal count 350.

In another embodiment, the count is maintained synchronously to the sample clock signal and the clearing at counts 340 and 348 is omitted. Instead, in the clock cycle after each pulse on the start waveforms 314 and 316, the count is synchronously started at a value of zero if the corresponding stop waveform 328 has a concurrent pulse, and the count is synchronously started at a value of one if the corresponding stop waveform 326 does not have a concurrent pulse.

Because the latency 334 is shown to be half of the sampling period between the active rising transitions of the sample clock waveforms 302 and 304, the sampling scenarios shown in FIGS. 3A and 3B are equally likely to occur when the sample clock waveforms 302 and 304 randomly sample the buffer input and output waveforms 306, 308, 318, and 320. Thus, if the sample clock waveforms 302 and 304 are asynchronous with the write and read clock signals, statistically the buffer input and output waveforms 306, 308, 318, and 320 are randomly sampled after a sufficient number of samples are taken, and for half of the detected patterns the terminal count is one as shown in FIG. 3A, and for the other half of the detected patterns the terminal count is zero as shown in FIG. 3B. Therefore, the average of the terminal counts is a value of one-half, which estimates the latency 334 of the FIFO buffer as half of the sampling period between the active rising transitions of the sample clock waveforms 302 and 304. This is the correct result.

Figure 4:
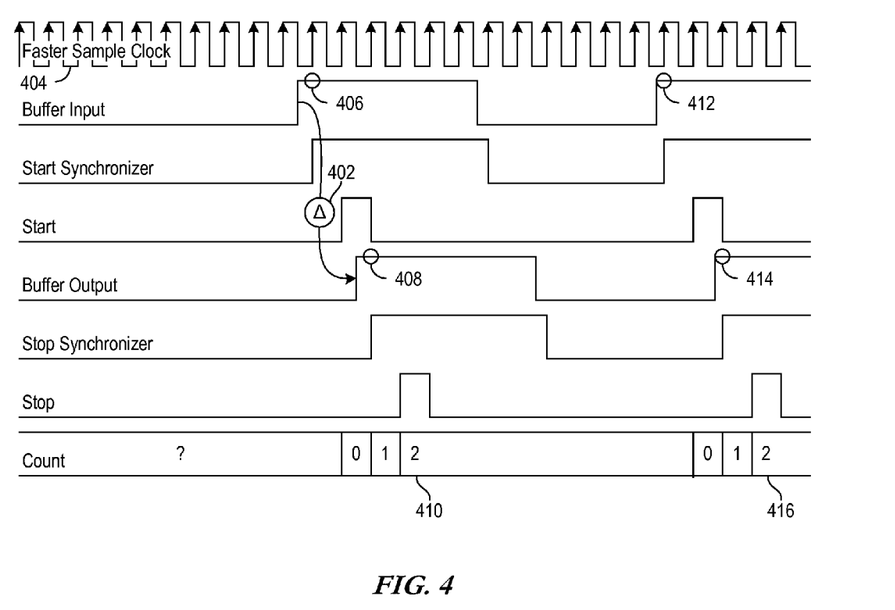
FIG. 4 is a timing diagram of another example operation of a circuit for estimating latency through a FIFO buffer in accordance with various embodiments of the invention.

FIG. 4 is a timing diagram of another example operation of a circuit for estimating latency through a FIFO buffer in accordance with various embodiments of the invention. FIG. 4 illustrates a latency 402 of the FIFO buffer that equals the latency 334 shown in FIGS. 3A and 3B, but the sample clock waveform 404 has one-quarter the sampling period of the sample clock waveforms 302 and 304 shown in FIGS. 3A and 3B. Thus, the latency 402 is two sampling periods between the active rising transitions of the sample clock waveform 404.

In the first pattern, the sample 406 of the input data values occurs two sampling periods before the sample 408 of the output data values. Thus, the terminal count 410 for this pattern is two. Similarly, samples 412 and 414 occur two sampling periods apart and the terminal count 416 for the second pattern is also two.

Regardless of the relative phase of the sample clock waveform 404, the terminal count is generally two. However, the terminal count might infrequently be one or three when the sample clock waveform 404 is aligned with the input and/or output data values such that sampling produces metastability, because then the metastability might resolve randomly in either direction. Despite this, the average of the terminal counts is two because any terminal counts of one or three from metastability occur infrequently enough to have no appreciable effect on an average over a sufficient number of samples. This is the correct result.

Figure 5:
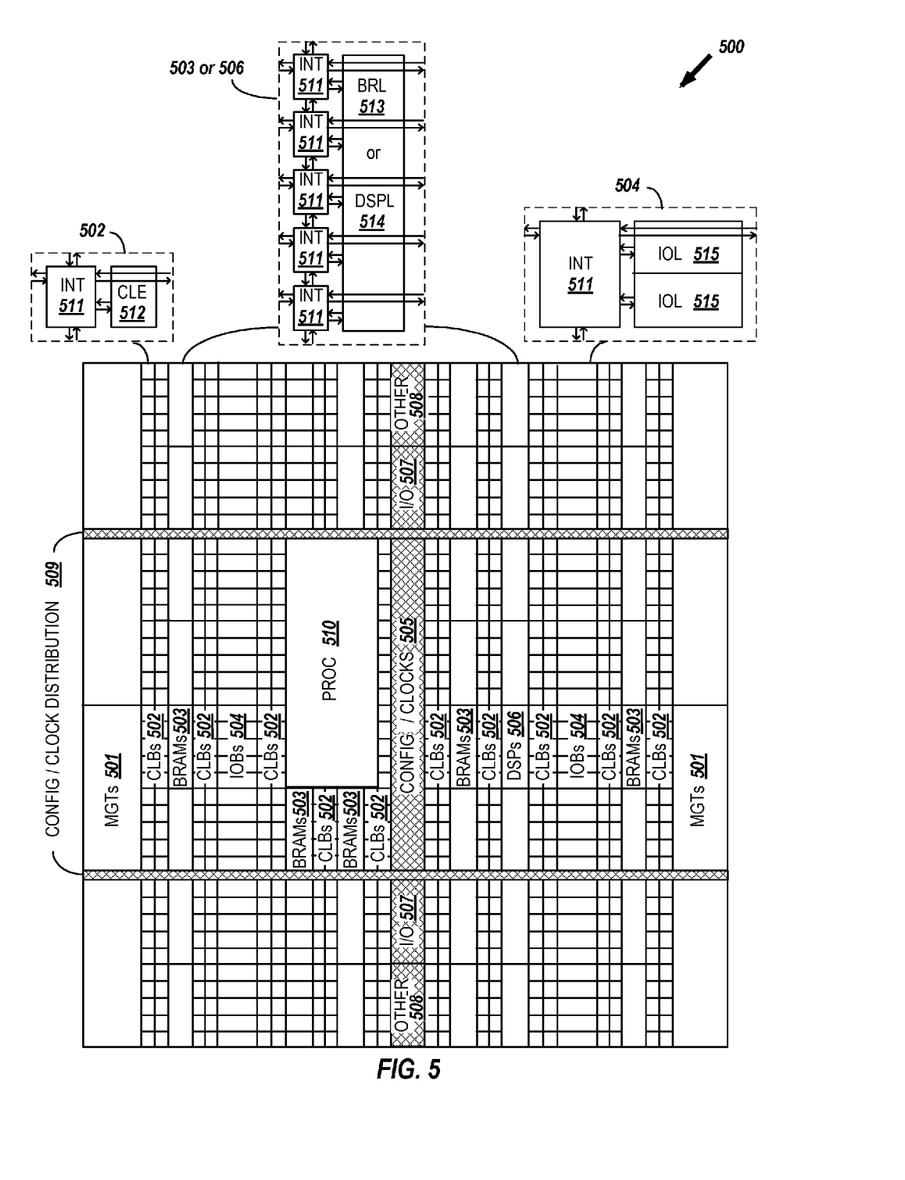
FIG. 5 is a block diagram of a programmable integrated circuit configurable to estimate latency through a FIFO buffer in accordance with various embodiments of the invention.

FIG. 5 is a block diagram of a programmable integrated circuit configurable to estimate latency through a FIFO buffer in accordance with various embodiments of the invention.

FPGAs can include several different types of programmable logic blocks in the array. For example, FIG. 5 illustrates an FPGA architecture (500) that includes a large number of different programmable tiles including multi-gigabit transceivers (MGTs) 501, configurable logic blocks (CLBs) 502, random access memory blocks (BRAMs) 503, input/output blocks (IOBs) 504, configuration and clocking logic (CONFIG/CLOCKS) 505, digital signal processing blocks (DSPs) 506, specialized input/output blocks (I/O) 507, for example, e.g., clock ports, and other programmable logic 508 such as digital clock managers, analog to-digital converters, system monitoring logic, and so forth. Some FPGAs also include dedicated processor blocks (PROC) 510 and internal and external reconfiguration ports (not shown).

In some FPGAs, each programmable tile includes a programmable interconnect element (INT) 511 having standardized connections to and from a corresponding interconnect element in each adjacent tile. Therefore, the programmable interconnect elements taken together implement the programmable interconnect structure for the illustrated FPGA. The programmable interconnect element INT 511 also includes the connections to and from the programmable logic element within the same tile, as shown by the examples included at the top of FIG. 5.

For example, a CLB 502 can include a configurable logic element CLE 512 that can be programmed to implement user logic plus a single programmable interconnect element INT 511. A BRAM 203 can include a BRAM logic element (BRL) 213 in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 206 can include a DSP logic element (DSPL) 214 in addition to an appropriate number of programmable interconnect elements. An 10B 204 can include, for example, two instances of an input/output logic element (IOL) 215 in addition to one instance of the programmable interconnect element INT 211. As will be clear to those of skill in the art, the actual I/O pads connected, for example, to the I/O logic element 215 are manufactured using metal layered above the various illustrated logic blocks, and typically are not confined to the area of the input/output logic element 215.

In the pictured embodiment, a columnar area near the center of the die (shown shaded in FIG. 2) is used for configuration, clock, and other control logic. Horizontal areas 209 extending from this column are used to distribute the clocks and configuration signals across the breadth of the FPGA.

Some FPGAs utilizing the architecture illustrated in FIG. 2 include additional logic blocks that disrupt the regular columnar structure making up a large part of the FPGA. The additional logic blocks can be programmable blocks and/or dedicated logic. For example, the processor block PROC 210 shown in FIG. 2 spans several columns of CLBs and BRAMs.

Note that FIG. 2 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/ logic implementations included at the top of FIG. 2 are purely exemplary. For example, in an actual FPGA more than one adjacent column of CLBs is typically included wherever the CLBs appear, to facilitate the efficient implementation of user logic.

In one embodiment, the multi-gigabit transceivers (MGTs) 501 include phase compensation buffers, and the latency of each phase compensation buffer is estimated using detectors partially implemented in dedicated logic in the MGTs 501 and partially implemented in the programmable logic and interconnect tiles, and using a counter and averaging circuit implemented in the programmable logic and interconnect tiles.

The present invention is thought to be applicable to a variety of systems for estimating a latency through a FIFO buffer. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A circuit for estimating a latency through a FIFO buffer, comprising:
   a first detector for detecting a first plurality of instances of a pattern in first data values serially written to a write port of the FIFO buffer;
   a second detector for detecting a second plurality of instances of the pattern in second data values serially read from a read port of the FIFO buffer, wherein the second data values are the first data values delayed by the latency through the FIFO buffer;
   a counter coupled to the first and second detectors and counting a count of active transitions of a sample clock signal, the counter started in response to each detected instance of the first plurality of instances and stopped in response to each detected instance of the second plurality of instances, wherein the count provides an estimate of the latency of the FIFO buffer; and
   a data generator coupled to the first detector and the write port of the FIFO buffer:
   wherein:
      the data generator generates the first data values and serially writes the first data values to the write port of the FIFO buffer;
      the first data values repeat the first plurality of instances of the pattern;
      the pattern includes a first block of zero values followed by a second block of one values;
      the first block of zero values has a first duration and the second block of one values has a second duration; and
      a sum of the first and second durations is greater than an upper limit on the latency.

2. The circuit of claim 1, wherein the first and second durations are equal, and the first and second durations are each greater than a sampling period between the active transitions of the sample clock signal.

3. The circuit of claim 1, wherein the write port of the FIFO buffer writes an input data word having a number of bits and the read port reads an output data word having the number of bits, the first data values are serially written to one of the bits of the input data word of the write port, and the second data values are serially read from a corresponding one of the bits of the output data word of the read port.

4. The circuit of claim 3, wherein:
   the FIFO buffer writes the input data word at the write port in response to a write clock signal;
   the FIFO buffer updates the output data word provided at the read port in response to a read clock signal;
   the write clock signal and the read clock signal have a nominally shared period and a varying phase relationship that is a varying multiple of the nominally shared period plus a varying fraction of the nominally shared period;
   the latency of the FIFO buffer is a varying multiple of the nominally shared period plus the varying fraction of the nominally shared period; and
   the sample clock signal is synchronous with at least one of the write clock signal and the read clock signal, a phase of the sample clock signal being rotated following each count for the first and second pluralities of instances of the pattern.

5. The circuit of claim 3, wherein:
   the FIFO buffer writes the input data word at the write port in response to a write clock signal;
   the FIFO buffer updates the output data word provided at the read port in response to a read clock signal;
   the write clock signal and the read clock signal have a nominally shared period and a varying phase relationship that is a varying multiple of the nominally shared period plus a varying fraction of the nominally shared period
   the latency of the FIFO buffer is the varying multiple of the nominally shared period plus the varying fraction of the nominally shared period; and
   the sample clock signal is asynchronous with both the write clock signal and the read clock signal.

6. The circuit of claim 5, further comprising an averaging circuit coupled to the counter, wherein the averaging circuit continuously provides the estimate that includes integer and fractional values with the estimate of the latency being the integer value times a sampling period between the active transitions of the sample clock signal plus the factional value of the sampling period.

7. The circuit of claim 6, wherein:
   the first detector includes:
      a first register for sampling the first data values at the active transitions of the sample clock signal and for synchronizing between the sample clock signal and the write clock signal; and
      a second register for starting the counter upon detecting a first data transition from a zero value to a one value at an output of the first register; and
   the second detector includes:
      a third register for sampling the second data values at the active transitions of the sample clock signal and for synchronizing between the sample clock signal and the read clock signal; and
      a fourth register for stopping the counter upon detecting a second data transition from a zero value to a one value at an output of the third register.

8. The circuit of claim 7, wherein:
   the averaging circuit provides the estimate that is updated for each first data transition to be a first fraction of a preceding value of the estimate plus a second fraction of a terminal value of the count output from the counter for the first data transition; and
   a sum of the first and second fractions is unity.

9. The circuit of claim 8, wherein a first number of the zero values in the first block of each first instance of the pattern equals a second number of the one values in the second block of each first instance of the pattern, and the first and second numbers equal a number of the nominally shared period sufficient to exceed the sampling period.

10. The circuit of claim 1, wherein the first and second durations are equal, and the first and second durations are greater than a period between the active transitions of the sample clock signal.

11. The circuit of claim 1, wherein:
the FIFO buffer has the write port for writing an input data word having a number of bits in response to a write clock signal and the read port for reading an output data word having the number of bits in response to a read clock signal;
the first data values are serially written to one of the bits of the input data word of the write port and the second data values are serially read from one of the bits of the output data word of the read port;
the write clock signal and the read clock signal have a nominally shared period and an indeterminately varying phase relationship that is a varying multiple of the nominally shared period plus a varying fraction of the nominally shared period;
the latency of the FIFO buffer is the varying multiple of the nominally shared period plus the varying fraction of the nominally shared period; and
the sample clock signal is synchronous with at least one of the write clock signal and the read clock signal, and a phase of the sample clock signal is rotated following each count for the first and second pluralities of instances of the pattern.

12. The circuit of claim 1, wherein:
the write port of the FIFO buffer writes an input data word having a number of bits in response to a write clock signal;
the read port of the FIFO buffer reads an output data word having the number of bits in response to a read clock signal;
the first data values are serially written to one of the bits of the input data word of the write port and the second data values are serially read from one of the bits of the output data word of the read port;
the write clock signal and the read clock signal have a nominally shared period and an indeterminately varying phase relationship that is a varying multiple of the nominally shared period plus a varying fraction of the nominally shared period;
the latency of the FIFO buffer is the varying multiple of the nominally shared period plus the varying fraction of the nominally shared period; and
the sample clock signal is asynchronous with both the write clock signal and the read clock signal.

13. The circuit of claim 1, further comprising an averaging circuit coupled to the counter, wherein the averaging circuit continuously provides the estimate that varies and includes integer and fractional values, and the estimate is the integer value times a period plus the factional value of the period.

14. The circuit of claim 1, wherein:
the first detector includes:
a first register for sampling the first data values at the active transitions of the sample clock signal and for synchronizing between the sample clock signal and a write clock signal for serially writing the first data values into the FIFO buffer; and
a second register for starting the counter upon detecting a transition from a zero value to a one value at an output of the first register; and the second detector includes:
a third register for sampling the second data values at the active transitions of the sample clock signal and for synchronizing between the sample clock signal and a read clock signal for serially reading the second data values from the FIFO buffer; and
a fourth register for stopping the counter upon detecting a transition from a zero value to a one value at an output of the third register.

15. The circuit of claim 1, wherein an averaging circuit provides the estimate that is updated for each count for the first and second pluralities of instances of the pattern to be a first fraction of a preceding value of the estimate plus a second fraction of the count, a sum of the first and second fractions being unity.

16. A circuit arrangement, comprising:
a FIFO buffer having a write port and a read port;
a first detector coupled to the write port of the FIFO buffer and configured to detect a first plurality of instances of a pattern in first data values serially written to the write port;
a second detector coupled to the read port of the FIFO buffer and configured to detect a second plurality of instances of the pattern in second data values serially read from the read port, wherein the second data values are the first data values delayed by a latency through the FIFO buffer;
a counter coupled to outputs of the first and second detectors, the counter configured to count active transitions of a sample clock signal, wherein the counter is started in response to each detected instance of the first plurality of instances and stopped in response to each detected instance of the second plurality of instances, and the count provides an estimate of the latency of the FIFO buffer; and
a data generator having an output coupled to an input of the first detector and to the write port of the FIFO buffer;
wherein:
the data generator generates the first data values and serially writes the first data values to the write port of the FIFO buffer;
the first data values repeat the first plurality of instances of the pattern;
the pattern includes a first block of zero values followed by a second block of one values;
the first block of zero values has a first duration and the second block of one values has a second duration; and
a sum of the first and second durations is greater than an upper limit on the latency.

17. The circuit arrangement of claim 16, wherein the first and second durations are equal, and the first and second durations are each greater than a sampling period between the active transitions of the sample clock signal.

18. A method for estimating a latency through a FIFO buffer, comprising:
detecting a first plurality of instances of a pattern in first data values serially written to a write port of the FIFO buffer;
detecting a second plurality of instances of the pattern in second data values serially read from a read port of the FIFO buffer, wherein the second data values are the first data values delayed by the latency through the FIFO buffer;
counting a count of active transitions of a sample clock signal, wherein the counting is started in response to each detected instance of the first plurality of instances and the counting is stopped in response to each detected instance of the second plurality of instances, and the count provides an estimate of the latency of the FIFO buffer;

generating the first data values; and serially writing the first data values to the write port of the FIFO buffer;

wherein:

the first data values repeat the first plurality of instances of the pattern, the pattern includes a first block of zero values followed by a second block of one values, the first block of zero values has a first duration and the second block of one values has a second duration, and a sum of the first and second durations is greater than an upper limit on the latency.

* * * * *